United States Patent
Lee

[11] Patent Number: 6,091,135
[45] Date of Patent: Jul. 18, 2000

[54] LEAD FRAME WITH PRE-MOLD PADDLE FOR A SEMICONDUCTOR CHIP PACKAGE

[75] Inventor: Byeong Duck Lee, Seoul, Rep. of Korea

[73] Assignee: LG Semicon Co., Ltd., Chungcheongbuk-Do, Rep. of Korea

[21] Appl. No.: 08/997,594

[22] Filed: Dec. 23, 1997

[30] Foreign Application Priority Data

Dec. 27, 1996 [KR] Rep. of Korea .................. 96-73493

[51] Int. Cl.⁷ .................. H05K 7/18; H01L 23/50; H01L 23/495
[52] U.S. Cl. .................. 257/676; 257/666; 257/788; 257/703; 257/793; 257/674; 257/649; 257/671
[58] Field of Search .................. 257/646, 669–674, 257/676, 678, 684, 782, 783, 788, 773, 703

[56] References Cited

U.S. PATENT DOCUMENTS

| | | | |
|---|---|---|---|
| 4,400,714 | 8/1983 | Brown | 257/669 |
| 4,466,183 | 8/1984 | Burns | 29/827 |
| 4,536,825 | 8/1985 | van Dyk Soerewyn | 361/386 |
| 4,651,415 | 3/1987 | Frampton | 29/827 |
| 4,763,409 | 8/1988 | Takekawa et al. | 257/672 |
| 5,214,846 | 6/1993 | Asami et al. | 29/827 |
| 5,233,222 | 8/1993 | Djennas et al. | 257/676 |
| 5,275,897 | 1/1994 | Nagesh et al. | 430/22 |
| 5,278,447 | 1/1994 | Vongfuangfoo et al. | 257/727 |
| 5,299,097 | 3/1994 | Kondo et al. | 257/666 |
| 5,521,428 | 5/1996 | Hollingsworth et al. | 257/669 |
| 5,539,251 | 7/1996 | Iverson et al. | 257/669 |
| 5,661,338 | 8/1997 | Yoo et al. | 257/670 |

FOREIGN PATENT DOCUMENTS

| | | | |
|---|---|---|---|
| 4-15947 | 1/1992 | Japan | 257/669 |
| 2003321 | 3/1979 | United Kingdom | 257/671 |

OTHER PUBLICATIONS

T. Cho, et al.; "An Improvement in Reflow Performance of Plastic Packages"; 46th Electronic Components & Technology Conference; May 1996; pp. 931–935.

N. Bhandarkar, et al. "Low–Stress Leadframe Design for Plastic IC Packages"; 46th Electronic Components & Technology Conference; May 1996; pp. 803–807.

*Primary Examiner*—Alexander Oscar Williams

[57] ABSTRACT

An improved lead frame with a pre-mold paddle for a semiconductor chip package which prevents delamination and cracking between a mold body and the pre-mold paddle on which a semiconductor chip in the semiconductor chip package is placed.

13 Claims, 7 Drawing Sheets

LEAD FRAME WITH PRE-MOLD PADDLE FOR A SEMICONDUCTOR CHIP PACKAGE

BACKGROUND OF THE INVENTION

1. Field of the Invention

The present invention relates to a lead frame with a pre-mold paddle for a semiconductor chip package and, more particularly, to an improved lead frame with a pre-mold paddle for a semiconductor chip package, which can prevent delamination and cracking between a mold body and the paddle on which a semiconductor chip is placed, in the semiconductor chip package.

2. Discussion of the Related Art

Referring to FIG. 1, the lead frame, a metal structure used in fabrication of the semiconductor chip package, includes in general guide rails 10 on both side of the lead frame 1a for supporting the lead frame 1a itself and guiding the lead frame 1a in the automatic transfer of the lead frame 1a during fabrication and a paddle 11 disposed at the center thereof for supporting the semiconductor chip 5. The lead frame 1a further includes inner leads 2, each for electrical connection to a bonding pad, a wire 12 which provides an external connection terminal for the semiconductor chip 5, and outer leads 13 which extend outside of the inner leads 2. A dam bar 14 is provided between the inner lead 2 and the outer lead 13 for supporting the inner lead 2 and the outer lead 13. The dam bar 14 is removed by trimming after the application of the EMC (Epoxy Molding Compound) molding. The paddle 11 is supported and connected to the body of the lead frame 1a by support bars 4a, and there are gaps between the inner leads 2 and the paddle 11.

However, in the aforementioned conventional lead frame 1a, the molded body 8 enclosing the semiconductor chip 5 and the paddle 11 is made of an EMC, whereas the paddle 11, which occupies the largest area of the lead frame 1a, made is of a copper alloy which is the same material as other elements but different from that of the molded body. Thus, the thermal coefficients of the molded body and the paddle are different from each other considering their properties. Because of this there is the problem of delamination, which is a separation of the close bonding between the bottom of the paddle 11 and the mold body 8 caused by shearing due to a difference in the thermal expansion coefficients between them during the packaging process, aging conducted after completion of the packaging, heat treatment for reliability test, and the operation of the package after it is mounted. And, if moisture infiltrates into the delamination, cracks can occur in the molded body 8 of the package, which causes many problems, such as a drop in production yield, and package defects during use of the package after mounting it on a board which leads to replacement of the package.

SUMMARY OF THE INVENTION

Accordingly, the present invention is directed to a lead frame with a pre-mold paddle for a semiconductor chip package that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the lead frame with a pre-mold paddle for a semiconductor chip package includes a pre-mold paddle of a moldable resin, e.g., an EMC disposed in an inner region of inner leads of the lead frame and connected to supporting bars extending from supporting elements of the lead frame for positioning a semiconductor chip thereon. The mold body which encapsulates the pre-mold paddle containing the semiconductor chip disposed thereon is a molded resin, e.g., an EMC which has substantially the same coefficient of thermal expansion as that of the pre-mold paddle.

It is to be understood that both the foregoing general description and the following detailed description are exemplary and explanatory and are intended to provide further explanation of the invention as claimed.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION OF THE PREFERRED EMBODIMENTS

Reference will now be made in detail to the preferred embodiments of the present invention, examples of which are illustrated in the accompanying drawings.

Figure 1:
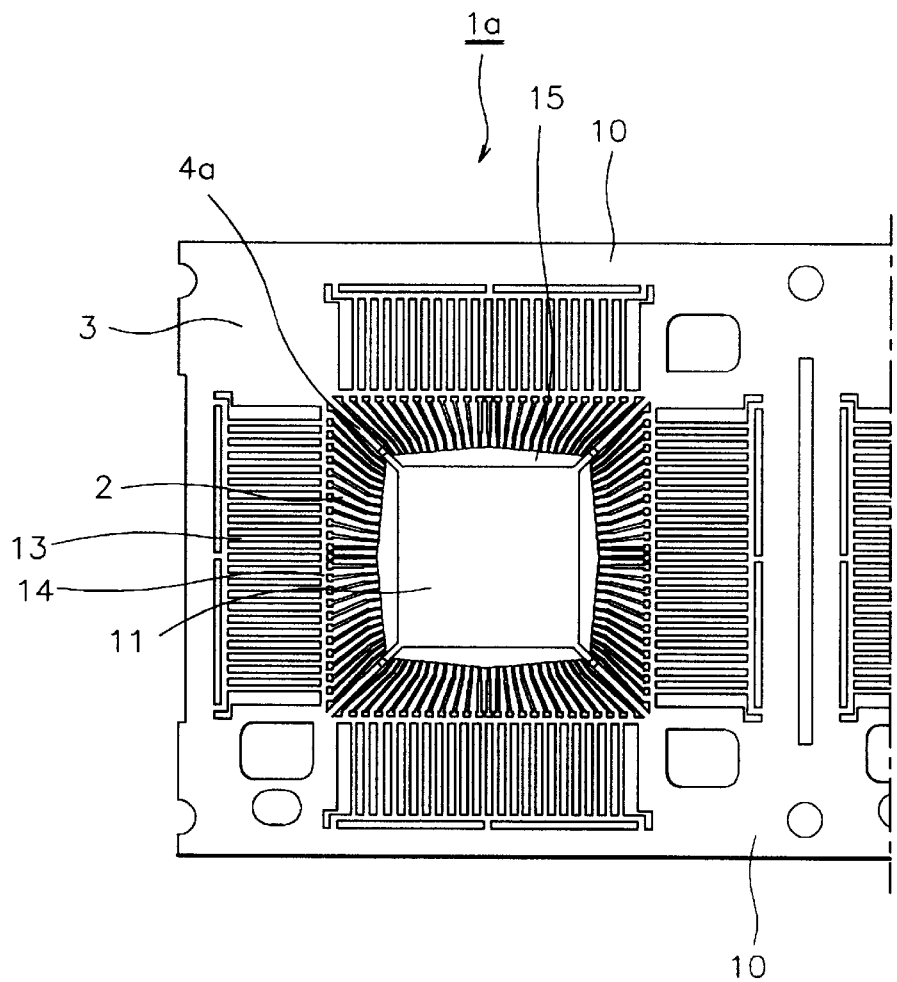
FIG. 1 illustrates a plan view of a conventional lead frame.
Figure 2:
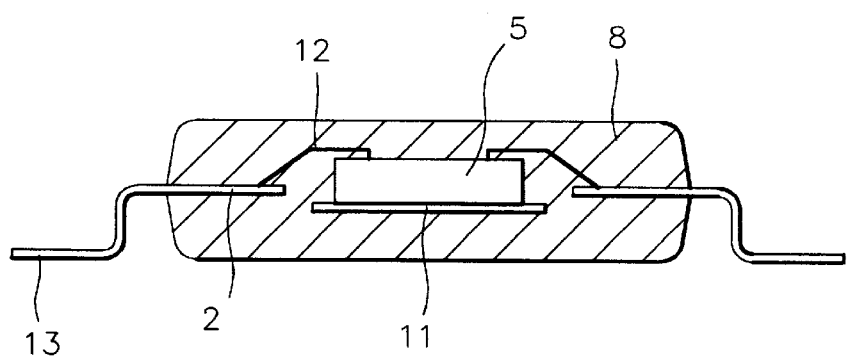
FIG. 2 illustrates a longitudinal section of a conventional semiconductor chip package.
Figure 3A:
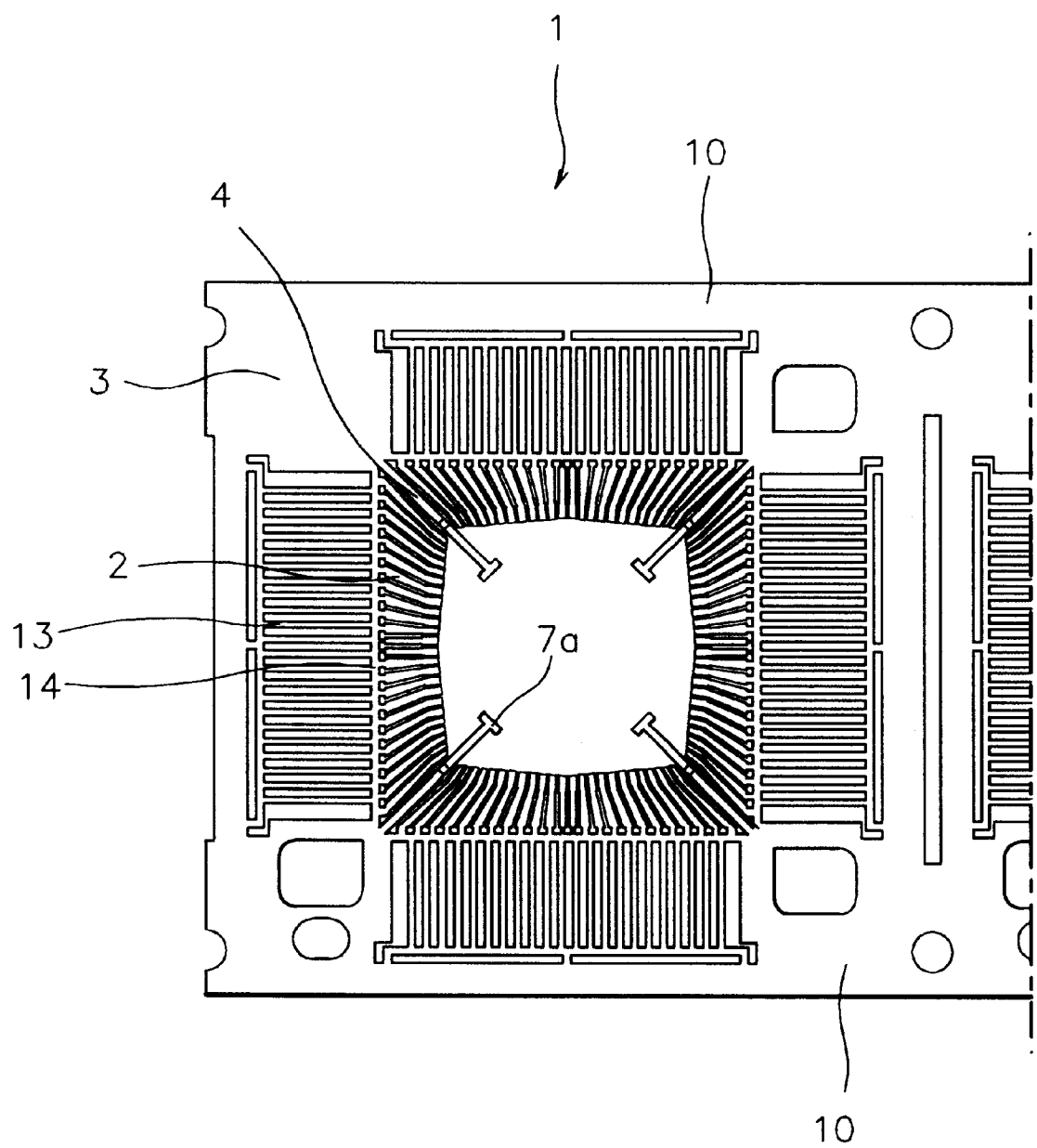
FIG. 3a illustrates a plan view of a lead frame in accordance with a first embodiment of the present invention.
Figure 3B:
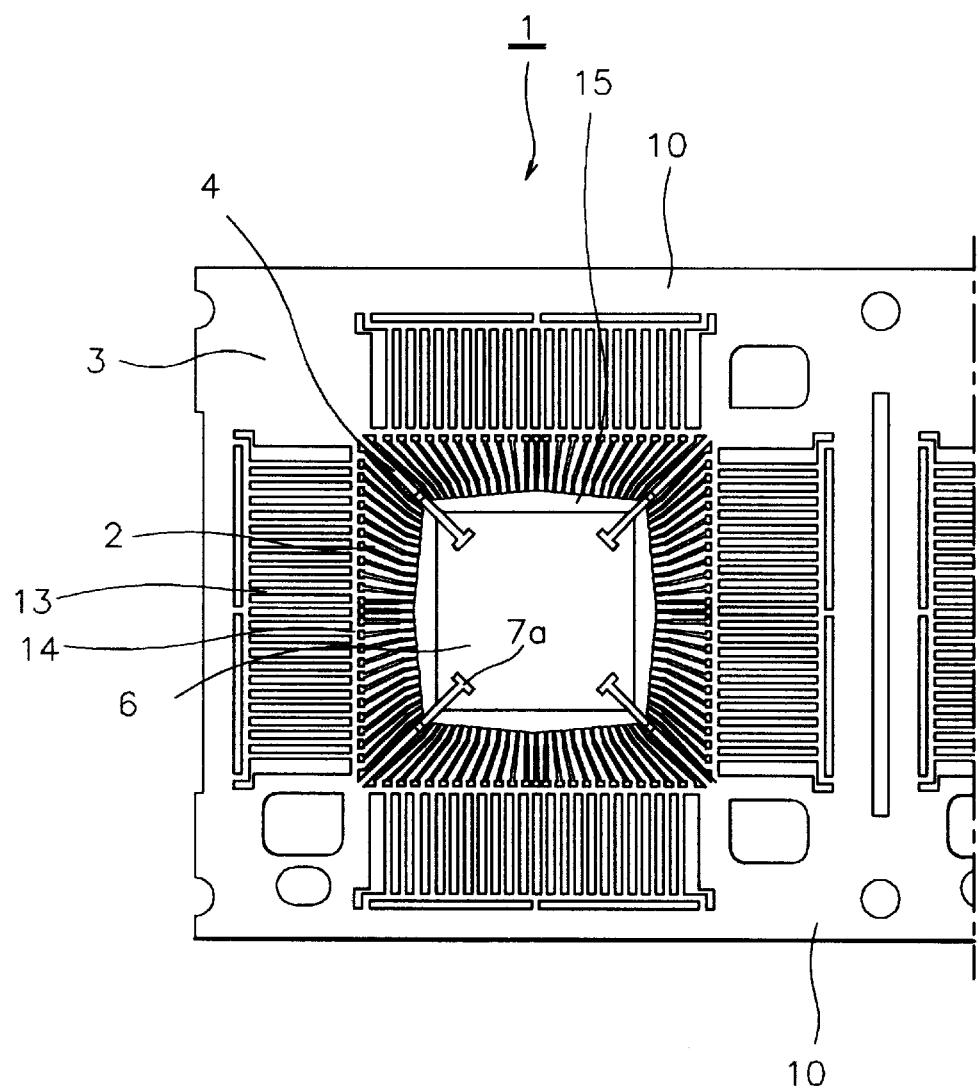
FIG. 3b illustrates a plan view of a lead frame in accordance with a first embodiment of the present invention showing a pre-mold paddle formed thereon.

FIG. 3a illustrates a plan view of a lead frame in accordance with the first embodiment of the present invention; FIG. 3b illustrates a plan view of a lead frame in accordance with a first embodiment of the present invention showing a pre-mold paddle formed thereon; and FIG. 4 illustrates a longitudinal section of a semiconductor chip package having the lead frame of the present invention applied thereto.

Figure 4:
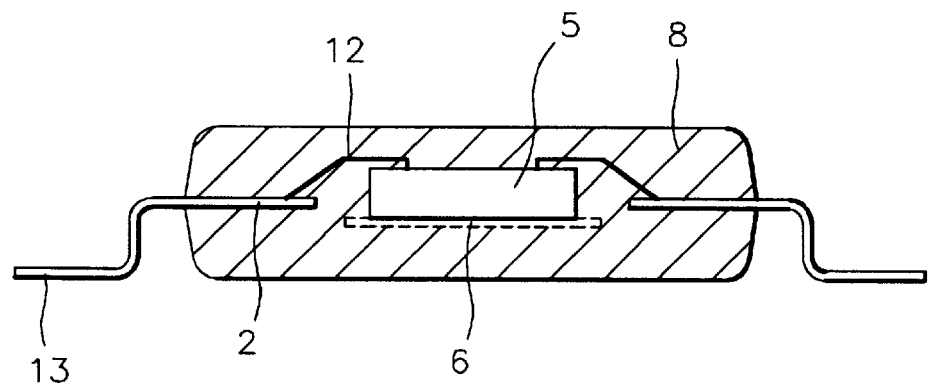
FIG. 4 illustrates a longitudinal section of a semiconductor chip package having the lead frame of the present invention applied thereto.

Referring to FIGS. 3a, 3b and 4, the lead frame in accordance with the first embodiment of the present invention includes supporting bars 4 extending from supporting elements of the lead frame 1. A paddle member 6 is disposed in an inner region surrounded by inner leads 2 of the lead frame 1 and the pre-mold paddle member which is made of an EMC, is formed on the supporting bars 4 for receiving at least one semiconductor chip 5. A pre-mold paddle supporting tip 7a is provided at the end of each of the supporting bars 4 which extend from supporting elements 3 of the lead frame 1 for supporting the pre-mold paddle 6. The pre-mold paddle supporting tip 7a is formed vertical to the axis of the supporting bar 4.

The function of the aforementioned lead frame of the present invention will now be explained.

Like the general lead frame, the lead frame of the present invention is also introduced into a packaging process after being separately fabricated in advance, but without a structure on which a semiconductor chip 5 is to be placed. The pre-mold paddle supporting tip 7a is only provided at the end of each of the supporting bars 4 which extend from the supporting elements 3 of the lead frame 1 to support the pre-mold paddle 6 when the pre-mold paddle is formed in a later step. Accordingly, after forming the pre-mold paddle 6 for placing the semiconductor chip 5 thereon through a pre-mold paddle forming step and before conducting the chip bonding step in the packaging process, the following steps, such as the chip bonding and wire bonding are conducted. Therefore, in order to proceed with the packaging process to which the lead frame of the present invention is applied, a molding step as a step for forming the pre-mold paddle 6 of EMC, which is the subject matter of the present invention, should be included in the lead frame fabrication process, or in the packaging process before the chip bonding step.

Thus, since the semiconductor chip packaging process of the present invention conducted by applying the lead frame 1 having the pre-mold paddle 6 formed therein in advance, follows the same sequence of steps as the general packaging process, the semiconductor chip packaging process has the advantage that changes in the steps of the semiconductor chip packaging process and of the package fabrication of equipment, following partial changes in the material of the lead frame and fabrication process, are not required. Accordingly, if a molding step for encapsulating the semiconductor chip 5 placed on the pre-mold paddle 6 is conducted after the completion of the chip bonding step, which is a unit step in the packaging process in which the semiconductor chip is bonded on the pre-mold paddle 6 and a wire bonding step in which the bonding pads on the semiconductor chip and the inner leads are electrically connected with wires 12, the lead frame 1 of the present invention facilitates the molding of the package by utilizing an EMC which is the same material as that of the pre-mold paddle 6. As a result, and as shown by the dotted line in FIG. 4, since the pre-mold paddle 6 containing the semiconductor chip 5 placed thereon is closely bonded to the mold body 8, and has the same thermal expansion coefficient as the mold body 8 because both are made of the same material with the same properties, the thermal mismatch which occurs during the semiconductor chip packaging process is eliminated. Thus, the delamination between the paddle 11 and the mold body 8 caused by the shearing force due to a difference in the thermal coefficients of the alloy paddle 11 and the mold body 8 enclosing the semiconductor chip 5, is eliminated, rendering the semiconductor chip more desirable and reliable.

Figure 5:
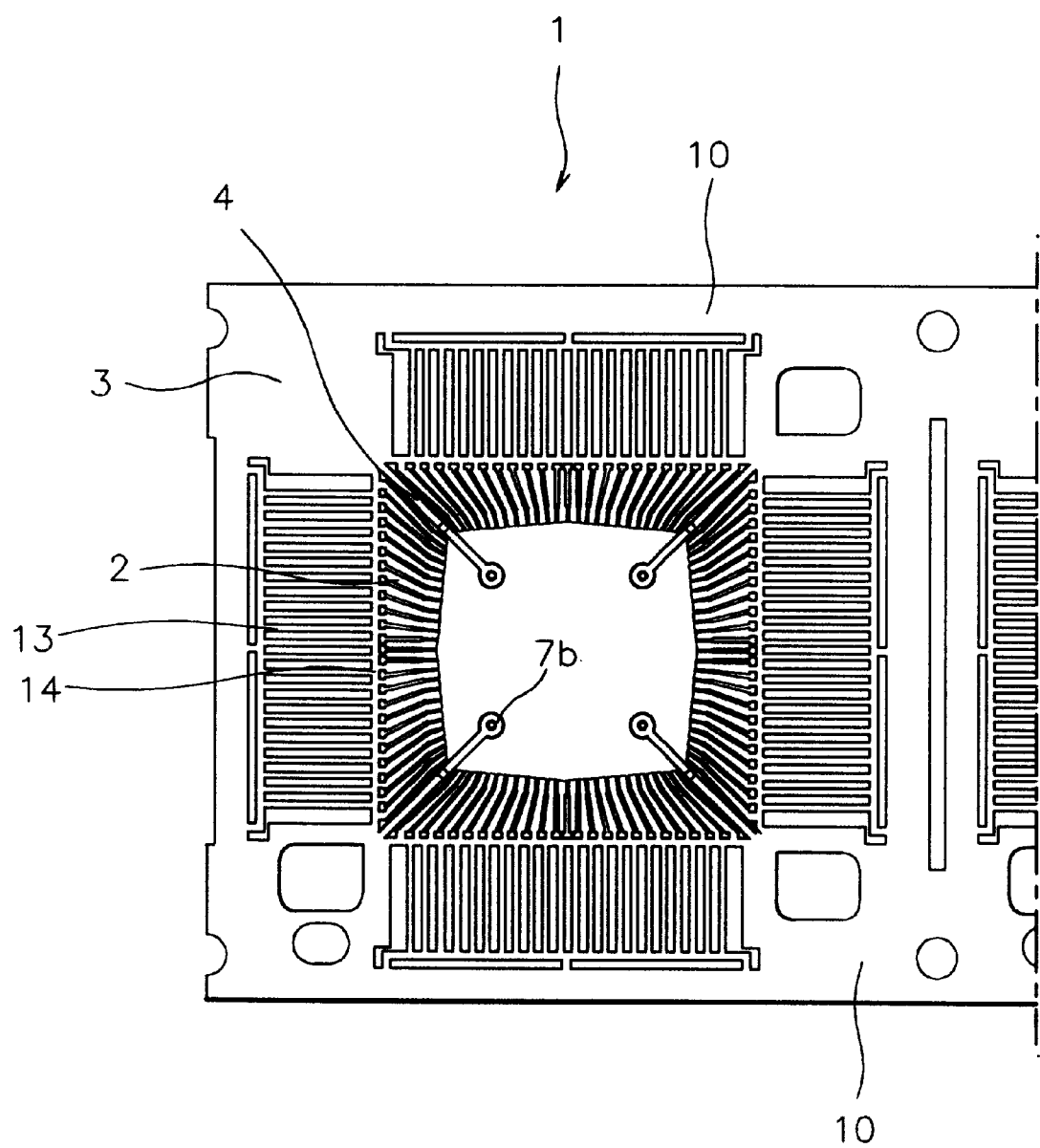
FIG. 5 illustrates a plan view of a lead frame in accordance with a second embodiment of the present invention.

FIG. 5 illustrates a plan view of a lead frame in accordance with a second embodiment of the present invention, showing a ring shaped pre-mold paddle support tip 7b disposed at the end of each of the supporting bars 4 extending from the supporting elements 3 of the lead frame 1 for supporting the pre-mold paddle 6.

Figure 6:
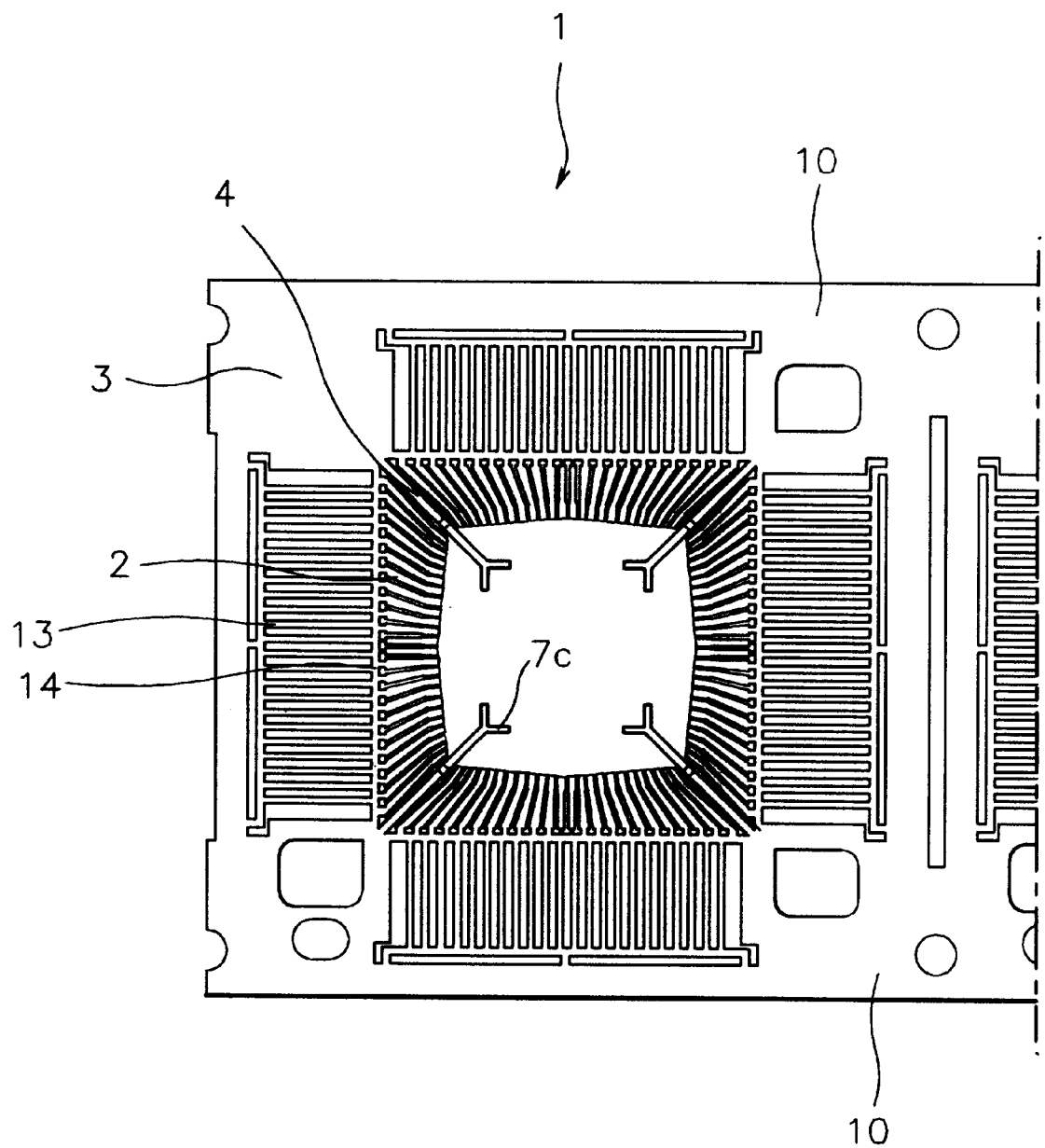
FIG. 6 illustrates a plan view of a lead frame in accordance with a third embodiment of the present invention.

FIG. 6 illustrates a plan view of a lead frame in accordance with a third embodiment of the present invention, showing a Y shaped tree structure, as a pre-mold paddle support tip 7c disposed at the end of each of the supporting bars 4 extending from the supporting elements 3 of the lead frame 1 for providing a wider area in supporting the pre-mold paddle 6.

Figure 7:
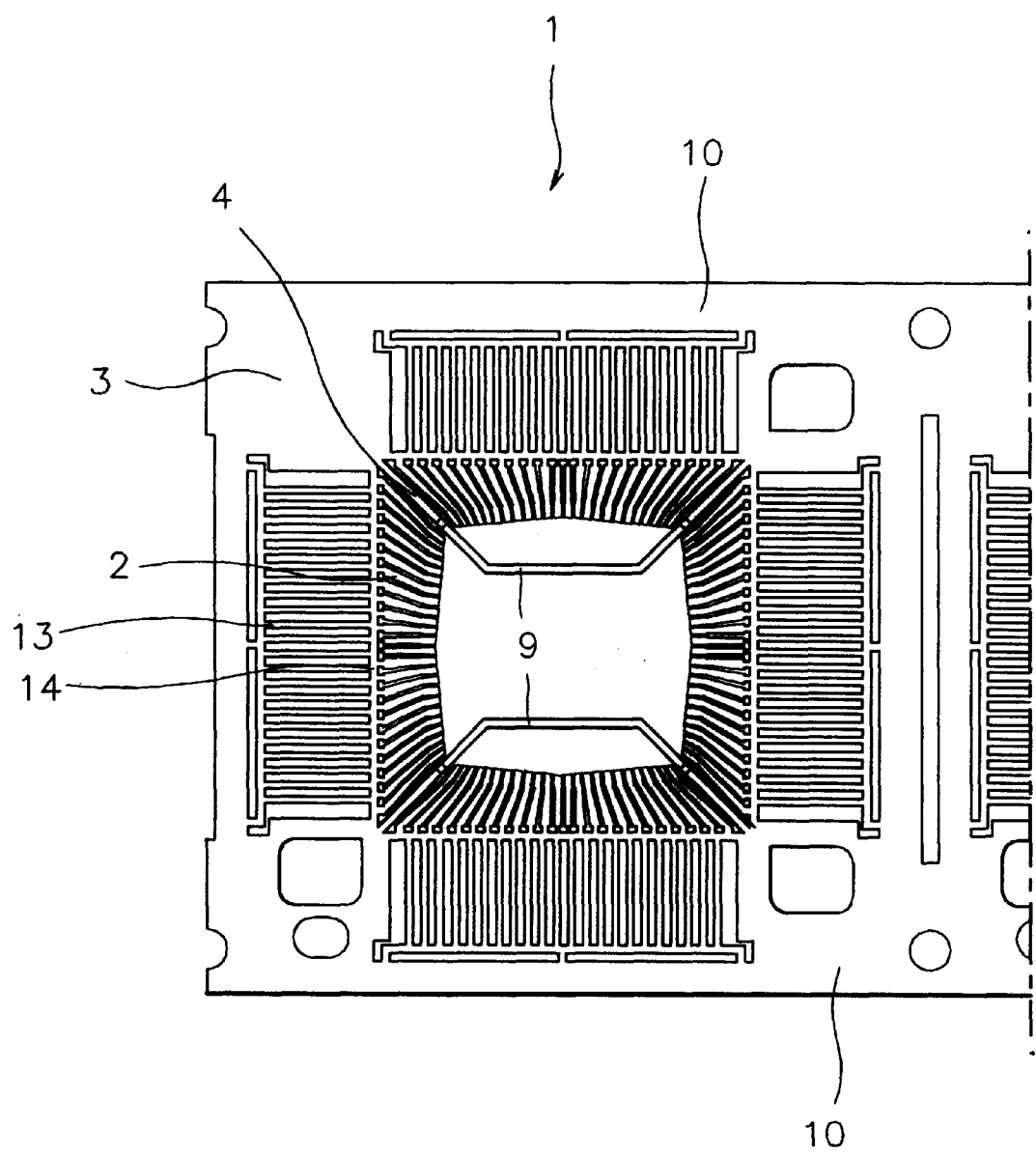
FIG. 7 illustrates a plan view of a lead frame in accordance with a fourth embodiment of the present invention.

FIG. 7 illustrates a plan view of a lead frame in accordance with a fourth embodiment of the present invention, showing a connecting bar 9 for connecting a pair of ends of the supporting bars 4 extending from the supporting elements 3 of the lead frame 1.

Figure 8:
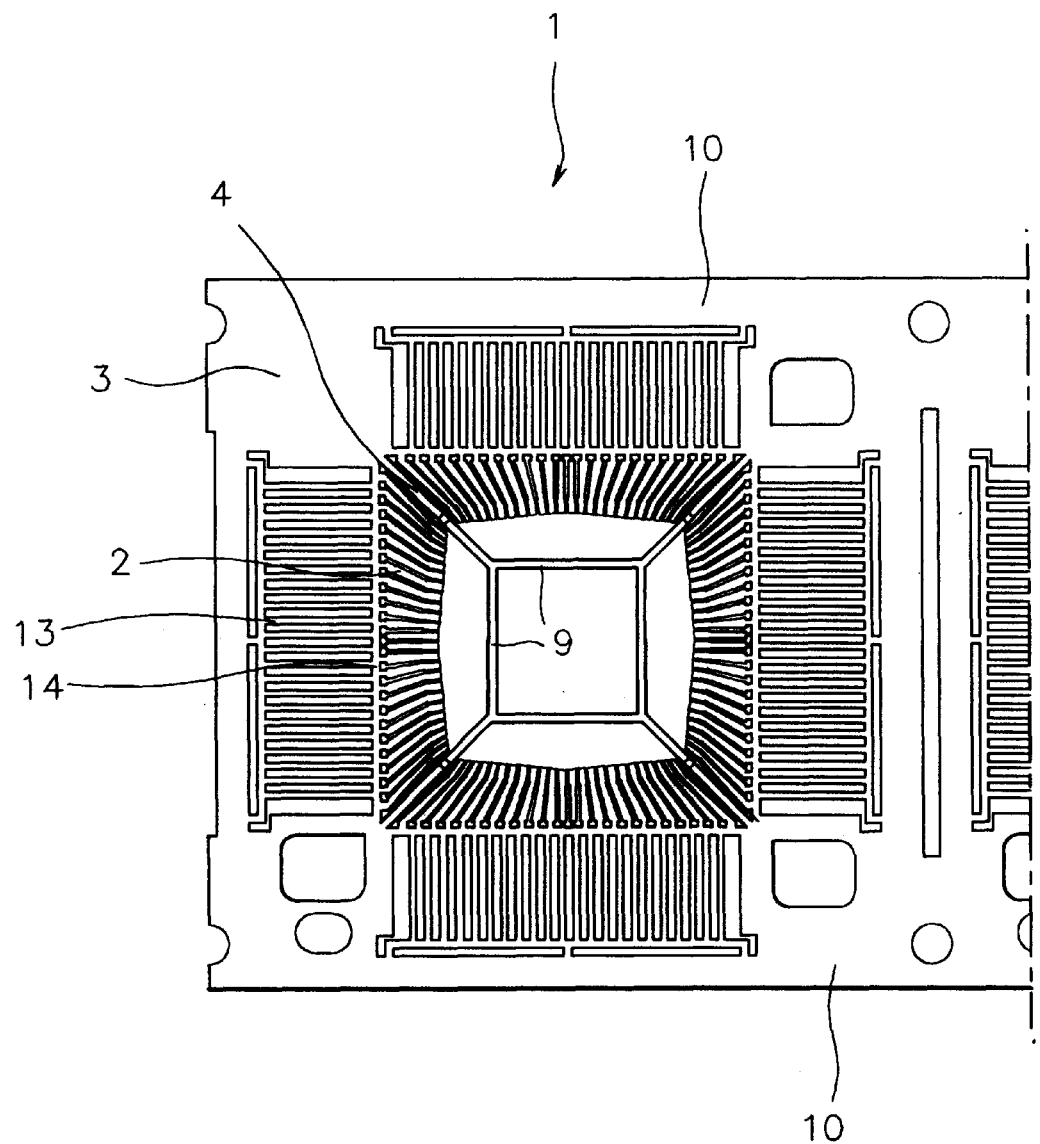
FIG. 8 illustrates a plan view of a lead frame in accordance with a fifth embodiment of the present invention.

FIG. 8 illustrates a plan view of a lead frame in accordance with a fourth embodiment of the present invention, showing a rectangular connecting ring 9 connecting all the ends of the supporting bars 4 extending from the supporting elements 3 of the lead frame 1.

It is apparent that variations in the geometric shape and structure of the pre-mold paddle support tip at the end of the supporting bars 4 of the lead frame 1 other than those discussed above would fall within the scope of the present invention. It is of course possible that the lead frame 1 with the pre-mold paddle 6 of the present invention can be applicable to all types of semiconductor chip packages that require paddles for placing semiconductor chips thereon.

As has been explained, the lead frame of the present invention improves the structure of the lead frame 1 in a semiconductor chip package, by facilitating the elimination of delamination and cracking between a semiconductor chip 5 and an EMC in the semiconductor chip package. That is, by the elimination of thermal mismatch which occurs in the course of semiconductor chip packaging, aging and/or reliability testing after completion of the packaging procedure, delamination can be prevented at an interface between the bottom of the paddle 11 and the EMC. Thus, the lead frame of the present invention improves the yield and reliability in semiconductor chip package production.

It will be apparent to those skilled in the art that various modifications and variations can be made in the lead frame with a pre-mold paddle for a semiconductor chip package of the present invention without departing from the spirit or scope of the invention. Thus, it is intended that the present invention cover the modifications and variations of this invention provided they come within the scope of the appended claims and their equivalents.

What is claimed is:

1. A semiconductor chip package comprising:
   a plurality of electrical leads extending radially from a central portion,
   a paddle member provided in said central portion,
   a semiconductor chip disposed on said paddle member, said semiconductor chip being electrically connected with said plurality of electrical leads, and
   a molded body encapsulating said semiconductor chip, said paddle member, and a portion of said plurality of leads, wherein coefficients of thermal expansion of said paddle member and said molded body are substantially the same.

2. The semiconductor chip package of claim 1, wherein said paddle member and said molded body are made from the same epoxy molding compound.

3. A lead frame including:
   a central portion and a plurality of electrical leads extending radially from said central portion;
   a paddle member provided in said central portion and being made from an epoxy molding compound, and
   at least one support member for supporting said paddle member in said central portion.

4. The lead frame of claim 3, wherein said at least one support member includes a paddle member supporting end portion at an end thereof proximate to said paddle member.

5. The lead frame of claim 4, wherein said paddle member supporting end portion is T-shaped.

6. The lead frame of claim 4, wherein said paddle member supporting end portion is Y-shaped.

7. The lead frame of claim 4, wherein said paddle member supporting end portion is ring-shaped.

8. The lead frame of claim 4, comprising a plurality of said support members, said plurality of support members including interconnected respective end portions thereof.

9. The lead frame of claim 8, comprising a rectangular connecting ring interconnecting said respective end portions.

10. The lead frame of claim 5, further comprising a semiconductor chip mounted on said paddle member.

11. A method for manufacturing a semiconductor chip package, comprising the steps of:

providing a lead frame comprising:

a central portion and a plurality of electrical leads extending radially from the central portion;

a paddle member disposed in the central portion, and at least one support member for supporting said paddle member in the central portion;

mounting a semiconductor chip on the paddle member;

electrically connecting the semiconductor chip to the plurality of electrical leads of the lead frame; and forming a chip package body by encapsulating the semiconductor chip, the paddle member, and a portion of the plurality of electrical leads in a first epoxy molding compound, the first epoxy molding compound and a material constituting the paddle member having substantially the same coefficients of thermal expansion.

12. The method according to claim 11, wherein the material constituting the paddle member is a second epoxy molding compound.

13. The method according to claim 12, wherein the first and second epoxy molding compounds are the same.

* * * * *